(12) United States Patent
Lee et al.

(10) Patent No.: US 10,957,654 B2
(45) Date of Patent: Mar. 23, 2021

(54) SEMICONDUCTOR PACKAGE AND METHOD OF MANUFACTURING THE SAME

(71) Applicant: NEPES CO., LTD., Chungcheongbuk-do (KR)

(72) Inventors: Jun-Kyu Lee, Cheongju-si (KR); Jaecheon Lee, Cheongju-si (KR)

(73) Assignee: NEPES CO., LTD., Eumseong-Gun (KR)

( * ) Notice: Subject to any disclaimer, the term of this patent is extended or adjusted under 35 U.S.C. 154(b) by 0 days.

(21) Appl. No.: 16/251,147

(22) Filed: Jan. 18, 2019

(65) Prior Publication Data
US 2019/0237407 A1    Aug. 1, 2019

(30) Foreign Application Priority Data

Jan. 29, 2018   (KR) .................. 10-2018-0010801

(51) Int. Cl.
*H01L 23/552* (2006.01)
*H01L 23/00* (2006.01)
(Continued)

(52) U.S. Cl.
CPC ............ *H01L 23/552* (2013.01); *H01L 21/56* (2013.01); *H01L 21/565* (2013.01); *H01L 21/6835* (2013.01); *H01L 23/3114* (2013.01); *H01L 23/3128* (2013.01); *H01L 23/3135* (2013.01); *H01L 23/5226* (2013.01); *H01L 23/5283* (2013.01); *H01L 23/562* (2013.01); *H01L 24/09* (2013.01); *H01L 24/17* (2013.01); *H01L 24/32* (2013.01); *H01L 24/73* (2013.01); *H01L 21/561* (2013.01); *H01L 21/568* (2013.01); *H01L 2221/68345* (2013.01); *H01L 2221/68372* (2013.01); *H01L 2224/0231* (2013.01);
(Continued)

(58) Field of Classification Search
CPC ............. H01L 23/552; H01L 23/3128; H01L 23/3114; H01L 23/5283; H01L 2224/04105; H01L 21/565; H01L 24/19; H01L 2224/12105; H01L 2224/92244; H01L 21/568; H01L 23/3135; H01L 2224/02379; H01L 2924/3025
See application file for complete search history.

(56) References Cited

U.S. PATENT DOCUMENTS

2011/0278703 A1* 11/2011 Pagaila ............. H01L 23/49827
257/659
2013/0228904 A1* 9/2013 Brunnbauer .......... H01L 23/552
257/659

FOREIGN PATENT DOCUMENTS

KR    20170138605 A    12/2017

OTHER PUBLICATIONS

Machine English translation of KR20170138605 (A).
Office Action issued in foreign counterpart Korean Patent Application No. 0-2018-0010801 dated May 18, 2020.

* cited by examiner

*Primary Examiner* — Jasmine J Clark
(74) *Attorney, Agent, or Firm* — Ladas & Parry LLP

(57) ABSTRACT

Provided are a semiconductor package and a method of manufacturing the same, the semiconductor package including an interconnection part including an insulation layer and an interconnection layer, a semiconductor chip disposed on the interconnection part and electrically connected to the interconnection layer through a bonding pad, and an EMI shielding part connected to the interconnection layer while covering the semiconductor chip and the interconnection part.

11 Claims, 10 Drawing Sheets

(51) Int. Cl.
*H01L 23/31* (2006.01)
*H01L 23/528* (2006.01)
*H01L 21/56* (2006.01)
*H01L 23/522* (2006.01)
*H01L 21/683* (2006.01)

(52) U.S. Cl.
CPC ............... *H01L 2224/02373* (2013.01); *H01L 2224/02379* (2013.01); *H01L 2224/73253* (2013.01)

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 2018-0010801, filed on Jan. 29, 2018 in the Korean Intellectual Property Office, the disclosure of which is incorporated herein by reference.

BACKGROUND

1. Field

The present disclosure relates to a semiconductor package and a method of manufacturing the same, and more specifically, to a semiconductor package and a method of manufacturing the same capable of reducing the electromagnetic interference phenomenon of the semiconductor package.

2. Description of the Related Art

In recent years, semiconductor devices are provided with the chip size reduced and the number of input/output terminals increased due to miniaturization of the process technology and diversification of functions, so that the pitches of electrode pads becoming finer, and as the convergence of various functions is accelerated, a system-level packaging technology for integrating a number of devices in a package is emerging.

However, as the operation speed of electronic parts is increased and various functions are added, the system-level packaging technology may have electromagnetic interference (EMI) between electronic parts, and in order to improve the EMI, an additional process is needed.

In the past, an EMI shielding process was applied to printed circuit boards (PCBs) and connectors, which results in poor EMI shielding performance compared to when applying an EMI shielding process to individual packages. In addition, as the size of the overall system increases, there is a recent trend to directly apply the EMI shielding technology to core chips.

In the case of a fan-out package, which is one of the technologies for directly applying the EMI shielding process to core chips, a semiconductor chip is attached to a PCB substrate using an adhesive, is electrically connected to the PCB substrate through wire bonding, and the semiconductor chip and the wire bonding are protected through EMC molding, forming an EMI shielding film on the front surface and side surfaces of the package.

However, the conventional fan-out package, when material for the EMI shielding is deposited, has a poor step coverage on the side surfaces of the package and thus a contact area between a shielding film and an interconnection layer under the semiconductor chip is decreased or the shielding film is opened, causing the EMI shielding performance to be significantly lowered.

In addition, the final package thickness is increased due to the use of the wire bonding and the PCB substrate, and the electrical performance is lowered due to the increased loop length of the wire.

RELATED ART DOCUMENT

Patent Document

Korean Registered Patent No. 10-0877551 (Jan. 7, 2009)

SUMMARY

Therefore, it is an object of the present disclosure to provide a semiconductor package capable of reducing the electromagnetic interference.

It s another object of the present disclosure to provide a semiconductor package capable of reducing the electromagnetic interference inside the semiconductor package.

Additional aspects of the disclosure will be set forth in part in the description which follows and, in part, will be obvious from the description, or may be learned by practice of the disclosure.

Therefore, it is an aspect of the present disclosure to provide a semiconductor package including: an interconnection part, including an insulating layer and an interconnection layer; a semiconductor chip provided on the interconnection part and electrically connected to the interconnection layer through a bonding pad; a frame provided on the interconnection part and provided with an accommodation part in which the semiconductor chip is disposed; and an electromagnetic interference (EMI) shielding part configured to cover lateral surfaces of the semiconductor chip and the accommodation part and provided with an exposing part exposed to an outside.

The frame may include: a first frame provided on the interconnection part, provided with a first accommodation part in which the semiconductor chip is disposed, and formed of a metal frame; and a second frame provided on the first frame while covering the first frame, provided with a second accommodation part in which the semiconductor chip is disposed, and formed of an insulating frame.

The interconnection part may include: a redistribution layer connected to the bonding pad of the semiconductor chip; a first insulating layer disposed between the semiconductor chip and the redistribution layer; and a second insulating layer disposed at a lower side of the redistribution layer, wherein the first frame is connected to the redistribution layer through a first opening formed through the first insulating layer.

The EMI shielding part may be connected to the redistribution layer through a second opening formed through the first insulating layer.

The semiconductor package may further include a packing material formed on the EMI shielding part to seal the semiconductor chip.

The semiconductor package may further include an external connection. Terminate electrically connected to the redistribution layer.

The semiconductor package may further include: a space part formed by the lateral surface of the semiconductor and the EMI shielding part disposed to be spaced apart from each other: and an insulating frame provided with an accommodation part in which the semiconductor chip, the EMI shielding part, and the space part are disposed.

The interconnection part may include: a redistribution layer connected to the bonding pad of the semiconductor chip; a first insulating layer disposed between the semiconductor chip and the redistribution layer, and provided with a protrusion extending along a circumference of the lateral surface of the semiconductor chip and inserted into the space part; and a second insulating layer disposed at a lower side of the redistribution layer.

The EMI shielding part may be connected to the redistribution layer through an opening formed through the first insulating layer.

The semiconductor package may further include an adhesive layer provided between the semiconductor chip and the EMI shielding part.

The semiconductor package may further include a primer part provided between the EMI shielding part and the insulating frame The semiconductor package may further include an external connection terminal electrically connected to the redistribution layer.

It is another aspect of the present disclosure to provide a method of manufacturing a semiconductor package, the method including: forming a frame on a carrier substrate; disposing a semiconductor chip including a bonding pad in an accommodation part of the frame; forming an Electro Magnetic Interference (EMI) shielding part that covers lateral surfaces of the semiconductor chip and the accommodation part; and forming an interconnection part including an interconnection layer connected to the bonding pad and an insulating layer, wherein, the forming of the frame includes: forming a first frame provided with a first accommodation part connected to the interconnection part and in which the semiconductor chip is disposed, the first frame formed of a metal frame; and forming a second frame provided on the first frame while covering the first frame and provided with a second accommodation part in which the semiconductor chip is, disposed, the second frame formed of an insulating frame.

The method may further include forming a packing material on the EMI shielding part to seal the semiconductor chip.

The method may further include forming an external connection terminal electrically connected to the redistribution layer.

It is another aspect of the present disclosure to provide a method of manufacturing a semiconductor package, the method including: forming an insulating frame provided with an accommodation part on a carrier substrate; forming an electromagnetic interference (EMI) shielding part on the insulating frame; disposing a semiconductor chip including a bonding pad in the accommodation part and the EMI shielding part; and forming an interconnection part including an interconnection layer connected to the bonding pad and an insulating layer, wherein the disposing of the semiconductor chip may include forming a space part defined by a lateral surface of the semiconductor and the EMI shielding part disposed to be spaced apart from each other, wherein the forming of the interconnection part includes: forming a first insulating layer on a surface of the semiconductor chip on which the bonding pad is disposed, while exposing the bonding pad, and provided with a protrusion inserted into the space part; and forming a redistribution layer connected to the bonding pad on the first insulating layer; and forming a second insulating layer on the redistribution layer to expose a part of the redistribution layer.

The forming of the first insulating layer may include forming an opening to expose the EMI shielding part, wherein the EMI shielding part may be connected to the redistribution layer through the opening.

The method may include: forming an adhesive layer provided between the semiconductor chip and the EMI shielding part.

The method may further include forming a primer part between the EMI shielding part and the insulating frame.

The method may further include forming an external connection terminal electrically connected to the redistribution layer.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Hereinafter, embodiments of the present disclosure will be described in detail with reference to the accompanying drawings. The following embodiments are provided to fully convey the spirit of the present disclosure to a person having ordinary skill in the art to which the present disclosure belongs. The present disclosure is not limited to the embodiments shown herein but may be embodied in other forms. In order to make the description of the present disclosure clear, unrelated parts are not shown and, the width, length, and thickness of components are exaggerated for clarity. Like numerals refer to like elements throughout the specification. In addition, the term "and/or" refers to a combination of a plurality of related, described items or any of the plurality of related, described items.

Hereinafter, a semiconductor package 100 according to an embodiment of the present disclosure will be described with reference to FIG. 1

Figure 1:
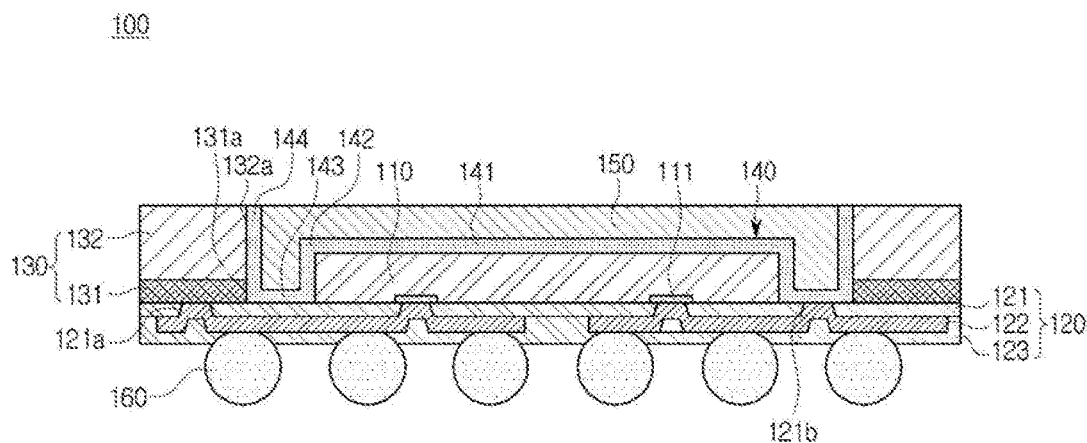
FIG. 1 is a cross-sectional view illustrating a semiconductor package according to an embodiment of the present disclosure.

FIG. 1 is a cross-sectional view illustrating the semiconductor package 100 according to the embodiment of the present disclosure.

Referring to FIG. 1, the semiconductor package 100 according to the embodiment of the present disclosure includes a semiconductor chip 110, an interconnection part 120, a frame 130, an electromagnetic interference (EMI) shielding part 140, a packing material 150, and an external connection terminal 160.

The semiconductor chip 110 is disposed on the interconnection part 120 and is electrically or electronically connected to the interconnection part 120 through a bonding pad 111.

The semiconductor chip 110 may be an integrated circuit (Die or Integrated Circuit, IC). The semiconductor chip 110 may be a memory chip or a logic chip. The memory chip may include a DRAM, an SRAM, a flash, a PRAM, an ReRAM, an FeRAM, an MRAM, and the like. The logic chip may be a controller that controls memory chips.

The semiconductor chip 110 may be various types of sensor chips capable of sensing an external stimulus. For example, the semiconductor chip 110 may be provided using an image sensor chip, a sensor chip for fingerprint recognition, a sensor chip for heat sensing, or a sensor chip for humidity sensing. The semiconductor chip 110 may be a sensor chip for fingerprint recognition, and the semiconductor package 100 of the present disclosure including the semiconductor chip 110 may be used for a sensor device, in particular, a fingerprint sensor.

The semiconductor chip 110 may have an active surface including an active area in which a circuit is formed and an inactive surface that is a surface opposite to the active surface.

The bonding pad 111 for exchanging signals with the outside may be formed on the active surface. In this case, the bonding pad 111 may be integrally formed with the semiconductor chip 110, and may be formed on the same plane as the active surface.

The semiconductor chip 110 may exchange signals with the outside through a bump attached to one surface of the semiconductor chip 110 rather than through the bonding pad 111. The bump attached to one surface of the semiconductor chip 110 may be a copper pillar bump or a solder bump.

The interconnection part 120 may be formed through a redistribution of a metal interconnection. For example, a metal interconnection having a fine pattern may be formed on one surface of a semiconductor wafer on which the bonding pad 111 is formed, that is, an active surface, using a photoresist process and a plating process.

The interconnection part 120 reroutes the semiconductor chip 110 to form a circuit. As the semiconductor chip 110 is rerouted by the interconnection part, the semiconductor package 100 may have a fan-out structure, the input/output terminals of the semiconductor chip 110 may be miniaturized and may be increased in number.

The interconnection part 120 may include a first insulating layer 121, a redistribution layer 122, and a second insulating layer 123. The first insulating layer 121, the redistribution layer 122, and the second insulating layer 123 may be sequentially stacked under the semiconductor chip 110.

The first insulating layer 121 may be disposed between the semiconductor chip 110 and the redistribution layer 122. The redistribution layer 122 may be disposed between the first insulating layer 121 and the second insulating layer 123. The second insulating layer 123 may be disposed under the redistribution layer 122.

The first insulating layer 121, the redistribution layer 122, and the second insulating layer 123 each may be provided in plural A layer including at least one of the first insulating layer 121, the redistribution layer 122 and the second insulating layer 123 may be provided in a plurality of layers stacked one on top of another.

The redistribution layer 122 may include a conductive material. The redistribution layer 122 may include a metal, and may include copper (Cu), aluminum (Al), or an alloy thereof.

The redistribution layer 122 may be connected to the bonding pad 111 of the semiconductor chip 110 and external connection terminals. The redistribution layer 122 may be connected to the bonding pad 111 of the semiconductor chip 110 a first frame 131 and the EMI shielding part 140 which will be described below.

The redistribution layer 122 may be formed on the first insulating layer 121 by a metal patterning technique.

The first insulating layer 121 and the second insulating layer 123 may include an organic or inorganic insulating material. The first insulating layer 121 and the second insulating layer 123 may include an, organic insulating material, such as an epoxy resin or the like, and may include an inorganic insulating material, such as silicon oxide (SiOx), silicon nitride (SiNx), and the like.

The first insulating layer 121 and the second insulating layer 123 may be formed by a dielectric coating. The first insulating layer 121 and the second insulating layer 123 may be formed using various methods, such as deposition, printing, or laminating.

The first insulating layer 121 may have a first opening 121a for exposing the first frame 131, which will be described below, and a second opening 121b for exposing the EMI shielding part 140.

The frame 130 may provide an overall frame of the semiconductor package 100 and include the first frame 131 and a second frame 132.

The first frame 131 is disposed on the interconnection part and has a first accommodation part 131a so that the semiconductor chip 110 may be disposed therein.

The first frame 131 may be disposed on the interconnection part to be spaced apart from the semiconductor chip 110 so that the EMI shielding part 140 may be installed between the first frame 131 and the semiconductor chip 110. The semiconductor chip 110 and the EMI shielding part 140 may be accommodated in the first accommodation part 131a when the first frame 131 is disposed on the interconnection part 120 to be spaced apart from the semiconductor chip 110.

The first frame 131 may be connected to the redistribution layer 122 through the first opening 121a formed through the first insulating layer 121.

The first frame 131 may be connected to the redistribution layer 122 through the second opening 121b formed through the first insulating layer 121 via the EMI shielding part 140. The first frame 131 may be connected to the redistribution layer 122 through a third surface 143 and a fourth surface 144 of the EMI shielding part 140 which will be described later.

The first frame 131 may be connected to, the redistribution layer 122 through the first opening 121a and the second opening 121b formed through the first insulating layer 121, and may be directly or indirectly connected to the redistribution layer 122. The first frame 131 may be directly connected to the redistribution layer 122 through the first opening 121a formed through the first insulating layer 121 and the first frame 131 may be indirectly connected to the redistribution layer 122 through, the second opening 121b formed through the first insulating layer 121 via the EMA shielding part 140.

The first frame 131 may be formed of a metal frame, and may include a conductive material. The first frame 131 may include a metal, and may include copper (Cu), aluminum (Al), or an alloy thereof.

The first frame 131 may serve to dissipate heat from the semiconductor chip 110 and may be formed of an embedded ground plane (EGP).

The first frame 131 may have a thickness smaller than that of the semiconductor chip 110. The first frame 131 may have the same thickness as that of the semiconductor chip 110.

The first frame 131 is disposed adjacent to a lateral surface of the semiconductor chip 110, so that the rigidity of the semiconductor package 100 itself is increased. That s even when an external impact is applied to the semiconductor package 100, the first frame 131 formed of a metal frame absorbs and disperses the impact primarily to reduce the impact applied to the semiconductor chip 110, so that the reliability of the semiconductor package 100 may be improved.

The second frame 132 is disposed on the first frame 131. The second frame 132 is disposed on the first frame 131 to cover the first frame 131 and has a second accommodation part 132a in which the semiconductor chip 110 is disposed.

The second frame 132 may be disposed on the first frame 131 to be spaced apart from the semiconductor chip 110 so that the EMI shielding part 140 is installed between the second frame 132 and the semiconductor chip 110. The semiconductor chip 110 and the EMI shielding part 140 may be accommodated in the second accommodation part 132a when the second frame 132 is disposed on the first frame 131 to be spaced apart from the semiconductor chip 110.

The second frame 132 may be formed of an insulating frame and may include an insulating material. The second frame 132 may include an epoxy mold (EMC) frame, and may include an, epoxy mold compound (EMC) or an encapsulant (packing material). The second frame 132 may be formed of various types of insulating materials and may include silicon, glass, ceramic, plastic, or polymer.

The second frame 132 may have the same shape and thickness as those of the first frame 131, or may have a thickness greater than that of the first frame 131. The second frame 132 may have the same shape as the first frame 131, but may have a thickness different from that of the first frame 131.

When the thickness of the second frame 132 is greater than the thickness of the first frame 131, the thickness of the first frame 131 may be minimized and the use of a metal having a high specific gravity may be minimized in manufacturing of the semiconductor package 100, so that the overall weight of the semiconductor package 100 may be reduced.

The second frame 132 may have a thickness greater than that of the semiconductor chip 110. The second frame 132 may have the same thickness a that of the semiconductor chip 110.

The sum of the thicknesses of the first frame 131 and the second frame 132 may be greater than the thickness of the semiconductor chip 110. The sum of the thicknesses of the first frame 131 and the second frame 132 may be equal to the sum of the thicknesses of the semiconductor chip 110, the EMI shielding part 140, and the packing material 150.

When the sum of the thicknesses of the first frame 131 and the second frame 132 is greater than the thickness of the semiconductor chip 110 or equal to the sum of the thicknesses of the semiconductor chip 110, the EMI shielding part 140, and the packing material 150, the second frame 132 may form the external appearance of the semiconductor package 100 together with the packing material 150.

One of the first frame 131 and the second frame 2, or both the first frame 131 the second frame 132 may be omitted.

The EMI shielding part 140 may be formed to cover the semiconductor chip 110 and surround the outer surface of the semiconductor chip 110 disposed on the interconnection part. The EMI shielding part 140 may be formed to surround the upper surface and the lateral surface of the semiconductor chip 110 disposed on the interconnection part 120.

The EMI shielding part 140 may be formed to cover the lateral surface of the first frame 131. The EMI shielding part 140 may be formed to cover the lateral surface of the second frame 132. The EMI shielding part 140 may be formed to cover the lateral surfaces of the first frame 131 and the second frame 132.

The EMI shielding part 140 includes a first surface 141 covering the upper surface of the semiconductor chip 110, a second surface 142 covering the lateral surface of the semiconductor chip 110, a third surface 143 making contact with the interconnection part 120, and a fourth surface 144 covering the lateral, surfaces of the first frame 131 and the second frame 132.

The first surface 141 may be formed in a layer on the semiconductor chip 110, and the second surface 142 may be formed in a bent shape bent at an end portion of the first surface 141 and extending along the lateral surface of the semiconductor chip 110, the third surface 143 may be formed in a bent shape bent at an end portion of the second surface 142 and extending along the interconnection part, and the fourth surface 144 may be formed in a bent shape bent at an end portion of the third surface 143 and extending along lateral surfaces of the first frame 131 and the second frame 132.

The EMI shielding part 140 may be connected to the redistribution layer 122, and may be connected to the redistribution layer 122 through the second opening 121b formed through the first insulating layer 121.

The EMI shielding part 140 may be electrically or electronically connected to the redistribution layer 122 and the first frame 131. The EMI shielding part 140 may be electrically or electronically connected to the redistribution layer 122 with the third surface 143 in contact with the redistribution layer 122, and may be electrically or electronically connected to the first frame 131 with the fourth surface 144 in contact with the first frame 131.

The EMI shielding part 140 may be formed in a thin film thinner than the semiconductor chip 110 so that slimming of the semiconductor package 100 is achieved.

The EMI shielding part 140 may be a shielding film capable of shielding Electro Magnetic Interference (EMI). The EMI shielding part 140 may include a conductive material including at least one selected from the group consisting of metals and ceramics. In detail, the EMI shielding part 140 may include at least one selected from the group consisting of copper (Cu), gold (Au silver (Ag) and titanium (Ti).

The EMI shielding part 140 may include a conductive resin. The conductive resin may be formed by adding at least one of aluminum, ceramics or silicon to a carbon based resin.

In addition, although the EMI shielding part 140 is illustrated as being provided in a single layer and sealing the semiconductor chip 110, the EMI shielding part 140 may be formed by consecutive coatings of two or more members having different functions. For example, the EMI shielding part 140 may be formed by sequentially coating a material having an EMI shielding function and a high strength material.

The packing material 150 is formed on the EMI shielding part 40. The packing material 150 may seal the semiconductor chip 110 such that the semiconductor chip 110, the interconnection part 120, and the first frame 131 are integrally formed each other, together with the second frame 132.

The packing material 150 may seal the entire surface of one side of the EMI shielding part 140, that is, the first to fourth surfaces 141, 142, 143 and 144. When the packing material 150 seals the first to fourth surfaces 141, 142, 143 and 144 of the EMI shielding part 140, the impact transmitted from the upper surface of the semiconductor chip 110 may be absorbed so that the semiconductor chip 110 is protected.

The packing material 150 may include an insulating material and may include an epoxy mold compound (EMC) or an encapsulant.

The packing material 150 may be injected in a fluidic state and then cured in a high temperature environment. That is, a process of applying heat and pressure to the packing material 150 may be performed, and a vacuum process may be added to remove gas or the like in the packing material 150. The semiconductor chip 110, the interconnection part, the first frame 131, the second frame 132, and the EMI shielding part 140 are integrally formed with each other to form a single structure as the packing material 150 is cured.

After the packing material 150 is sealed, the semiconductor package 100 may have a rectangular cross section.

The EMI shielding part 140 may be exposed to the outside of the packing material 150. The EMI shielding part 140 may be exposed to the outside of the packing material 150 in the form of a rectangular band, a circular band, or a polygonal band. The EMI shielding part 140 exposed to the outside of the packing material 150 may include an end portion of the fourth surface 144 of the EMI shielding part 140, and the end portion of the fourth surface 144 may be provided in the form of a rectangular band, a circular band, or a polygonal band.

The minimum diameter of the EMI shielding part 140 exposed to the outside of the packing material 150 or the minimum diameter of the entire EMI shielding part 140 may be 0.1 to 5 times the maximum diameter of the semiconductor chip 110.

A separate EMI shielding film, film or sheet connected to the EMI shielding part 140 may be formed on the surfaces of the packing material 150 and the frame 130. When the EMI shielding part 140 may be formed using a conductive molding material, the EMI shielding part 140 may serve as the packing material 150 instead, of the packing material 150.

The external connection terminal 160 is disposed under the interconnection part and electrically or electronically connected to the interconnection part. The external connection terminal 160 may be electrically or electronically connected to the redistribution layer 122 to be connected to the semiconductor chip 110. The external connection terminal 160 may be electrically or electronically connected to the redistribution layer 122 through a separate metal layer, such as a bump.

The external connection terminal 160 may be electrically or electronically connected to the semiconductor chip 110 so that the external connection terminal 160 may input and output electrical and electronic signals with the semiconductor chip 110.

The external connection terminal 160 is electrically or electronically connected to the interconnection part and may be used as a medium for connecting the semiconductor package 100 to an external circuit or another semiconductor package. For example, the external connection terminal 160 may be connected to the redistribution layer 122 or the bump metal layer at one side thereof and may be exposed to the outside at the other side thereof.

Although a solder ball is illustrated as an example of the external connection terminal 160, the external connection terminal 160 may be provided as other materials than a solder bump or solder.

The surface of the external connection terminal 160 is subject to surface treatment, such as organic coating or metal plating, to be prevented from being oxidized. The organic coating may be achieved by an Organic Solder Preservation (OSP) coating, and the metal plating may be gold (Au), nickel (Ni), lead (Pb), or silver (Ag) plating.

Hereinafter, a method of manufacturing a semiconductor package according to an embodiment of the present disclosure will be described.

In the following description, parts identical to those of the semiconductor package 100 described with reference to FIG. 1 will be simplified or omitted.

FIGS. 2 to 15 are cross-sectional views illustrating a method of manufacturing the semiconductor package shown in FIG. 1.

Referring to FIGS. 1 to 15, the method of manufacturing the semiconductor package 100 according to the embodiment of the present disclosure includes forming the frame 130 on a carrier substrate C, disposing the semiconductor chip 110 including the bonding pad 111, forming the EMI shielding part 140 connected to the redistribution layer 122 while covering the semiconductor chip 110, forming the packing material 150 that seals the EMI shielding part 140, grinding the EMI shielding part 140, and forming an interconnection part 120 including the redistribution layer 122, which is connected to the bonding pad 111, on the semiconductor chip 110.

Figure 2:
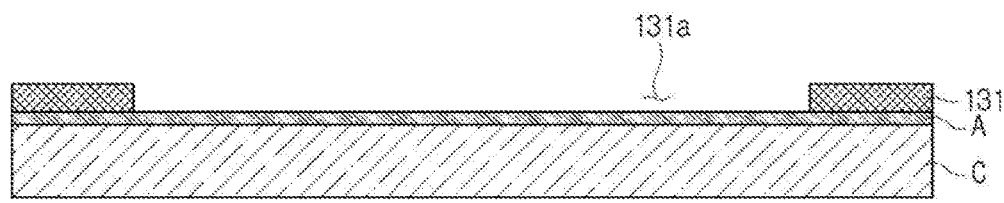
FIGS. 2 to 15 are cross-sectional views showing a method of manufacturing the semiconductor package shown in FIG. 1.
Figure 3:
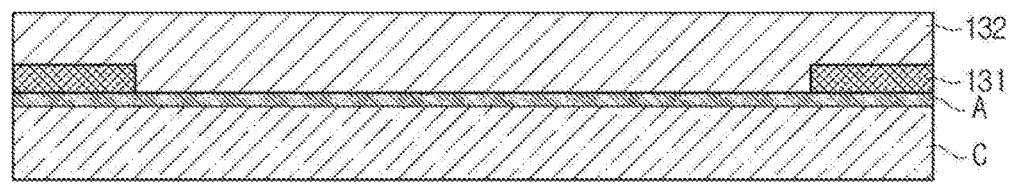
Figure 4:

FIGS. 2 to 4 illustrate steps for forming the frame 130. Referring to FIG. 2, the first frame 131 is formed on the carrier substrate C on which an adhesive layer A is formed. The first frame 131 may be formed to have the first accommodation part 131*a* in which the semiconductor chip 110 is disposed.

The carrier substrate C is a substrate having an auxiliary function, such as leveling the lower surfaces of the semiconductor chip 110 and the first frame 131, and may be implemented as a ceramic substrate, a silicon or a silicon oxide substrate, a glass substrate, or the like. The carrier substrate C may be provided at wafer level. The shape and size of the carrier substrate C are not limited and may be variously changed depending on the type of the semiconductor chip or the design of the semiconductor chip.

Referring to FIG. 3, the second frame 132 for covering the first frame 131 is formed after the first frame 131 is formed. The second frame 132 may include an insulating material, such as an epoxy mold compound (EMC) or an encapsulant (packing material). The EMC is molded and processed on the first frame 131 in the same shape as that of the first frame 131.

Referring to FIG. 4, the frame 130 including the first frame 131 and the second frame 132 stacked one on top of another is separated from the carrier substrate C. The frame 130 may be formed as a separate independent component or product and the semiconductor package 100 may be manufactured using a prefabricated frame 130 without performing the process of forming the first frame 131 and the second frame 132.

The first frame 131 and the second frame 132 may be provided as separately manufactured and independent components or products. The frame 130 may be formed by attaching the separately manufactured first and second frame 131 and 132 to each other. The frame 130 may be provided by attaching the first frame 131 to the carrier substrate C, and then attaching the second frame 132 to the first frame 131.

Figure 5:
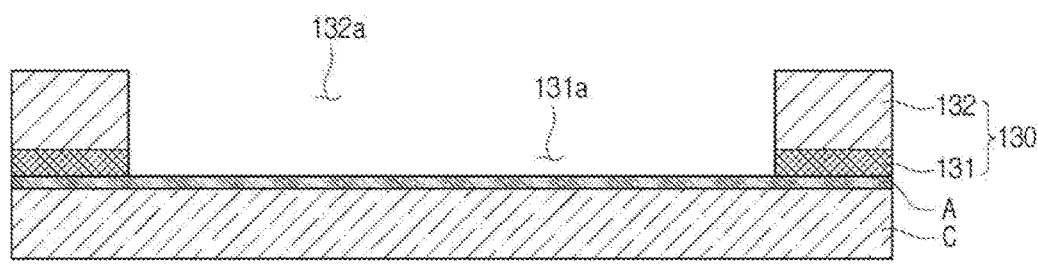
Figure 6:
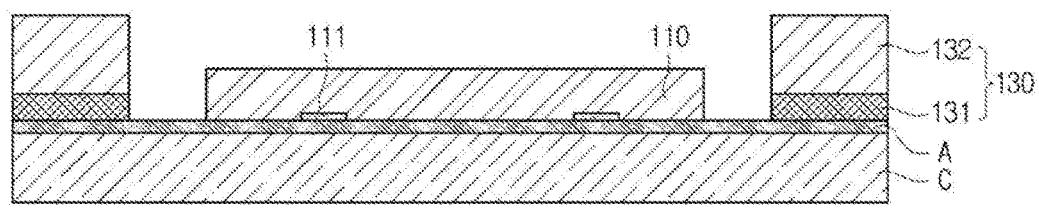

Referring to FIGS. 5 and 6, after the frame 130 is disposed on the carrier substrate C on which the adhesive layer A is formed, the semiconductor chip 110 is, placed to be disposed in the first accommodation part 131*a* and the second accommodation part 132*a*.

Figure 7:
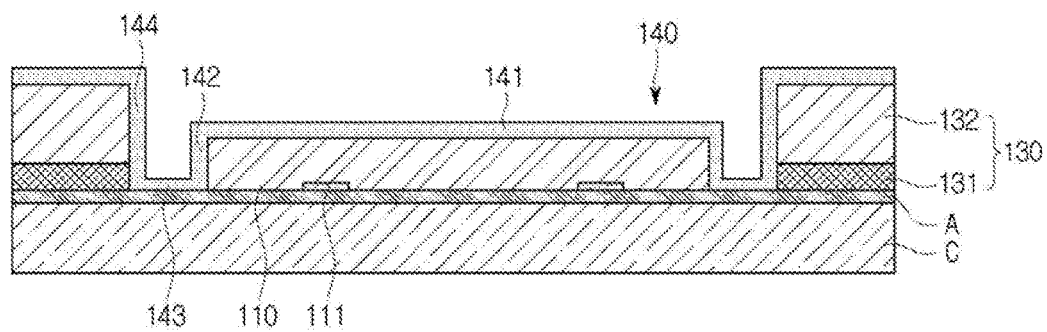

Referring to FIG. 7, the EMI shielding part 140 is formed to cover the semiconductor chip 110 while being connected to the redistribution layer 122. The EMI shielding part 140 may be formed to cover the first frame 131 and the second frame 132 while in contact with the lateral surface of the first frame 131, the lateral surface of the second frame 132, and the upper surface of the second frame 132. That is, the EMI shielding part 140 may be formed over the entire surface of the carrier substrate C on which the semiconductor chip 110 is disposed and the frame 130 is formed.

The EMI shielding part 140 may be formed along inner surfaces of the accommodation parts 131a and 132a. The EMI shielding part 140 may be formed along the upper surface of the semiconductor chip 110, the lateral surface of the semiconductor chip 110, and the inner surfaces of the accommodation parts 131a and 132a. The inner surfaces of the accommodation parts 131a and 132a may include a bottom surface and a lateral surface of the first accommodation part 131a and a lateral surface of the second accommodation part 132a.

The EMI shielding part 140 may be a shielding film capable of shielding EMI, and may include a conductive material including at least one selected from the group consisting of metals and ceramics. The EMI shielding part 140 may include at least one selected from the group consisting of copper (Cu), gold (Au), silver (Ag) and titanium (Ti).

Although the EMI shielding part 140 is illustrated as being provided in a single layer and sealing the semiconductor chip 110, the EMI shielding part 140 may be formed by consecutive coatings of two or more members having different functions. For example, the EMI shielding part 140 may be formed by sequentially coating a material having an EMI shielding function and a high strength material.

Figure 8:
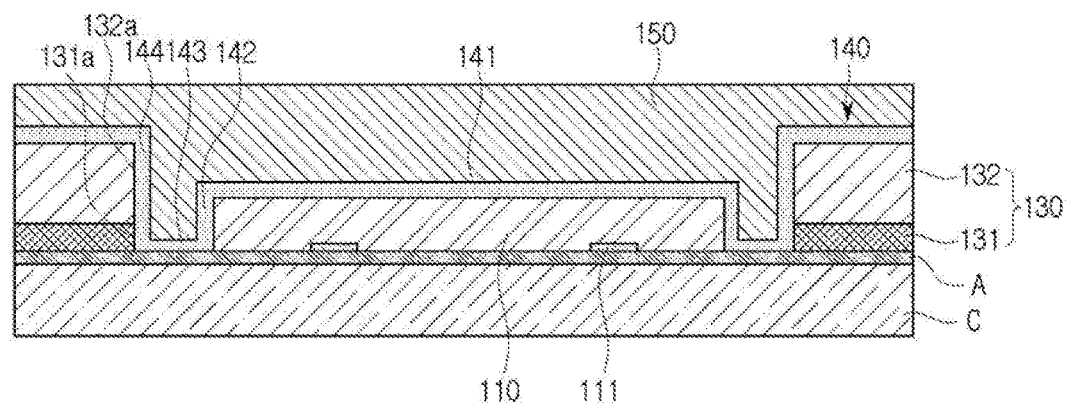

Referring to FIG. 8, after the EMI shielding part 140 is formed, a sealing is performed using the packing material 150. The packing material 150 may include an insulating material, and may include an epoxy mold compound (EMC) or an encapsulant (packing material).

The packing material 150 may seal the semiconductor chip 110 to cover the EMI shielding part 140. Accordingly, the packing material 150 allows the EMI shielding part 140 to be protected without being exposed to the outside, thereby preventing the EMI shielding part 140 including a metal from being oxidized and allowing the semiconductor chip 110 and the frame 130 to be integrally formed with each other.

The packing material 150 may mold or seal the inside of the accommodation parts 131a and 132a. The packing material 150 may mold or seal the inside of the accommodation parts 131a and 132a in which the EMI shielding part 140 is formed.

Figure 9:
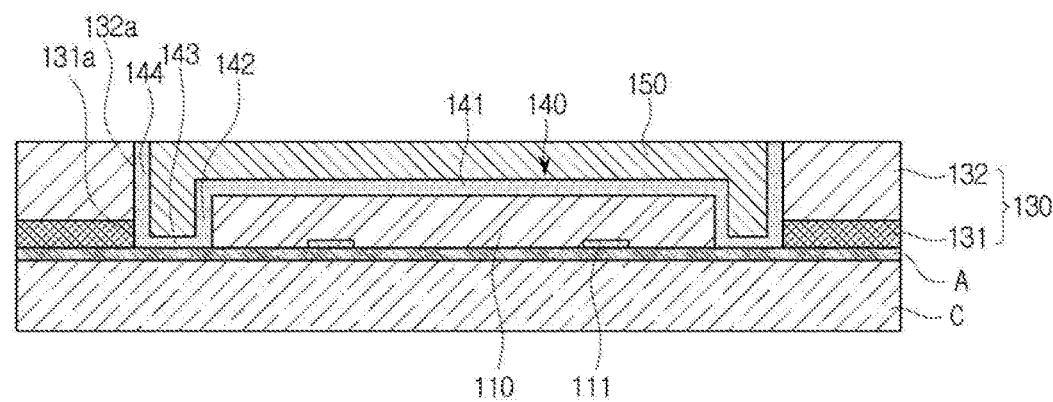
Figure 10:
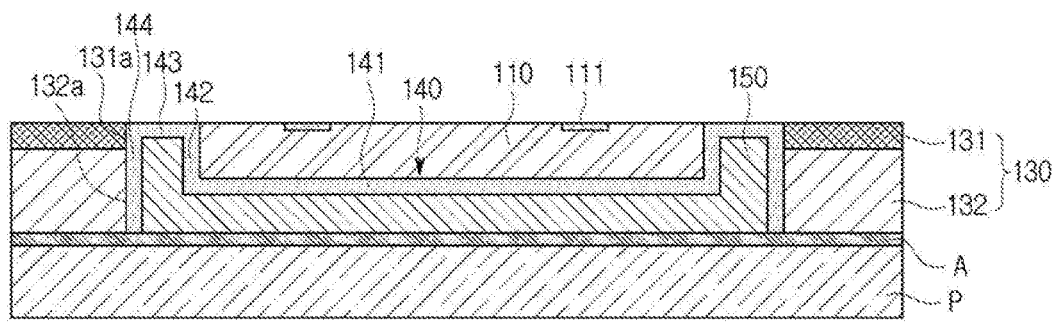

Referring to FIG. 9, after the sealing of the packing material 150, the packing material 150 is removed so that the upper surface of the second frame 132 is exposed to the outside. The packing material 150 may be removed by grinding, and in the removal of the packing material 150, remaining portions except for the first surface 141, the second surface 142, the third surface 143, and the third surface 143 of the EMI shielding part 140 are removed together with each other.

When the packing material 150 is removed so that the upper surface of the second frame 132 is exposed to the outside after the sealing of the packing material 150, the semiconductor package 100 may be sealed by the packing material 150 and the second frame 132, and the weight, thickness, and volume of the semiconductor package 100 may be reduced by the amount of the removed portions of the packing material 150 and the EMI shielding part 140.

That is, the semiconductor package 100 may be sealed using the packing material 150 and the second frame 132, and in this case, sealing of the semiconductor package 100 and slimming of the semiconductor package 100 may be achieved at the same time.

Referring 10, the carrier substrate C, which is attached to the semiconductor chip 110 integrated into one structure through the packing material 150, is removed, and the opposite side of the semiconductor chip 110, that is, the packing material 150 is bonded to face an adhesive layer (A) of a process carrier substrate (P). Accordingly, the surface, on which the bonding pad 111 is formed, that is, an active surface of the semiconductor chip 110 may be exposed upward.

The process carrier substrate P may be provided at wafer level or panel level. The process carrier substrate P may be a rigid type material, and may be provided using a molded substance or such as a polyamide tape.

The adhesive layer A may be a configuration to come the semiconductor chip 110 into close contact, and may be disposed on one side of the process carrier substrate P or not depending on the manufacturing process. The adhesive layer A may be provided using a double-sided adhesive film, of which one surface is attached and fixed to the process carrier substrate P, and the other surface is attached and fixed to the packing material 150.

Figure 11:
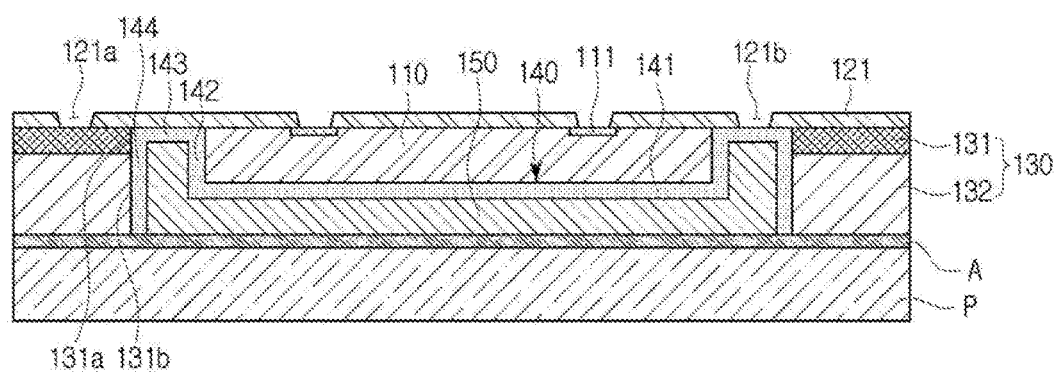

Referring to FIG. 11, the first insulating layer 121 is formed on the active surface of the semiconductor chip 110, that is, a surface of the semiconductor chip 110 on which the bonding pad 111 is formed. The first insulating layer 121 may be formed by coating an insulating material on one surface of the semiconductor chip 110 and performing a patterning process on the insulating material to form a hole for exposing the bonding pad 111. The insulating material may be provided using photosensitive polyimide (PI, Polyimide) or Thick PI (Polyimide).

The first insulating layer 121 may be provided by forming a membrane in the form of a film using polyimide (PI), and then patterning the membrane through an exposure process or the like.

The first opening 121a for exposing the first frame 131 and the second opening 121b for exposing the EMI shielding part 140 may be formed together during the patterning of the first insulating layer 121.

Figure 12:
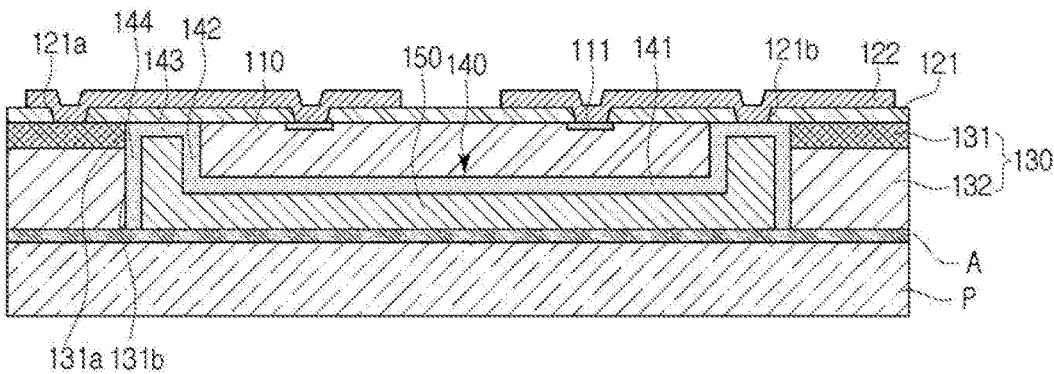

Referring to FIG. 12, the redistribution layer 122 is formed on the patterned first insulating layer 121. The redistribution layer 122 is connected to the bonding pad 111. The redistribution layer 122 is connected to the first frame 131 through the first opening 121a and is connected to the EMI shielding part 140 through the second opening 121b. The redistribution layer 122 may be formed as a metal pattern by coating a metal material on the first insulating layer 121 and then performing a photoresist process or the like on the coated metal. The redistribution layer 122 may be coated through a general plating process.

The redistribution layer 122 is deposited or filled on the bonding pad 111, the first insulating layer 121, the first opening 121a, and the second opening 121b using a process, such as electroless plating, electrolytic plating, sputtering, and the like. For example, the redistribution layer 122 may be a metal coating layer formed by performing a patterning process on the surfaces of the bonding pad 111 and the first insulating layer 121 and the inner surfaces of the first opening 121a and the second opening 121b, and may include copper, a copper alloy, aluminum, or an aluminum alloy.

More specifically, a seed layer is formed by performing electroless plating, electrolytic plating, sputtering, or printing on the surfaces of the bonding pad 111 and the first insulating layer 121 and the inner surfaces of the first opening 121a and the second opening 121b, and a resist pattern is formed on the seed layer using a mask. Subsequently, a plating liquid is supplied from an open region of the resist pattern to form a metal coating layer, thereby forming the redistribution layer 122 on the surfaces of the bonding pad 111 and the first insulating layer 121, and the inner surfaces of the first opening 121a and the second opening 121b. Then, the mask is removed, and the seed layer is removed by an etching process.

Meanwhile, the redistribution layer 122 may include a plurality of interconnection part layers, and insulating layers may be additionally disposed between the interconnection part layers. At this time, the interconnection part, which is subsequently stacked, may be provided by performing the above-described patterning process on the insulating layer.

As the semiconductor chip 110 is redistributed by the redistribution layer 122, the semiconductor package 100 is provided to have a fan-out structure.

Figure 13:
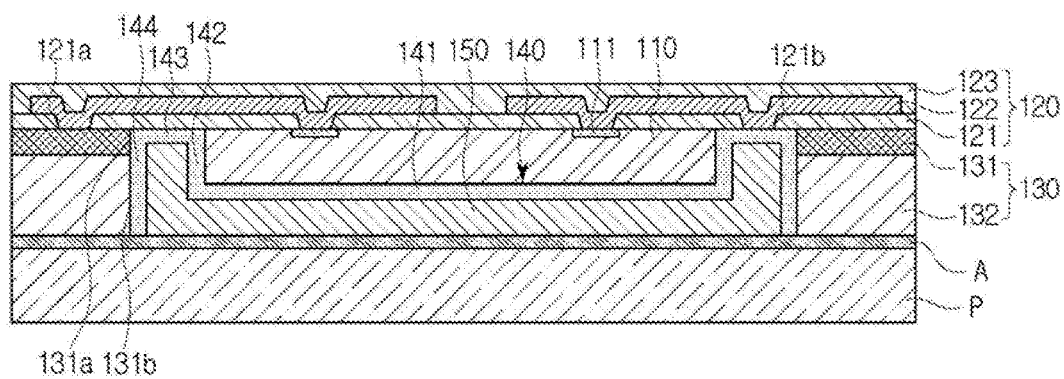

Referring to FIG. 13, the second insulating layer 123 is formed on the redistribution layer 122. The second insulating layer 123 is formed by coating an insulating material on the redistribution layer 122 and performing a patterning on the coating to form a hole for exposing a part of the redistribution layer 122. The insulating material may include photosensitive PI (Polyimide) or Thick PI (Polyimide).

Figure 14:
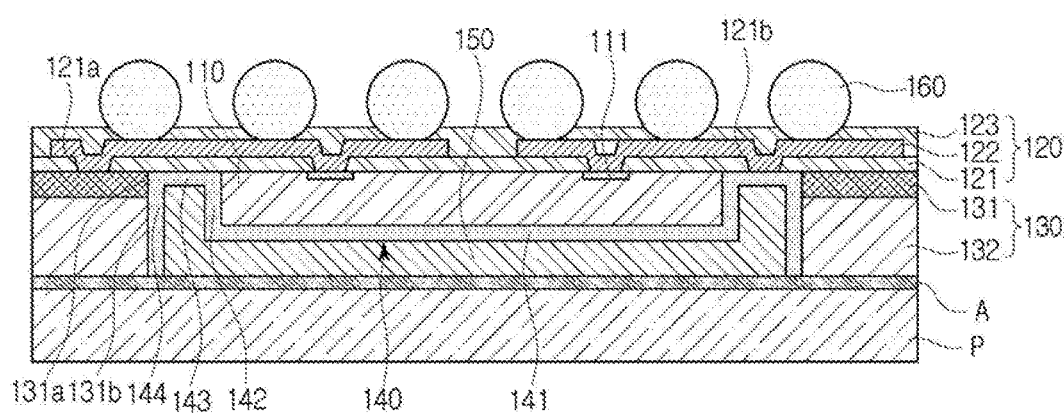

Referring to FIG. 14, the external connection terminal 160 is formed on the interconnection part 120 connected to the semiconductor chip 110.

The external connection terminal 160 may be connected to the redistribution layer 122 through the hole formed through the second insulating layer 123, and alternatively, may be connected to the redistribution layer 122 through a separate bump metal layer. In the case of the bump metal layer, through which the external connection terminal 160 is connected to the redistribution layer 122, the bump metal layer is formed by coating a metal material on the second insulating layer 123 and then performing a photoresist process on the coated metal material, to form a metal pattern.

The external connection terminal 160 may be electrically or electronically connected to the interconnection part 120, and may be used as a medium for connecting the semiconductor package 100 to an external circuit or another semiconductor package. For example, the external connection terminal 160 may be connected to the redistribution layer 122 at one side thereof and may be exposed to the outside at the other side thereof.

Figure 15:
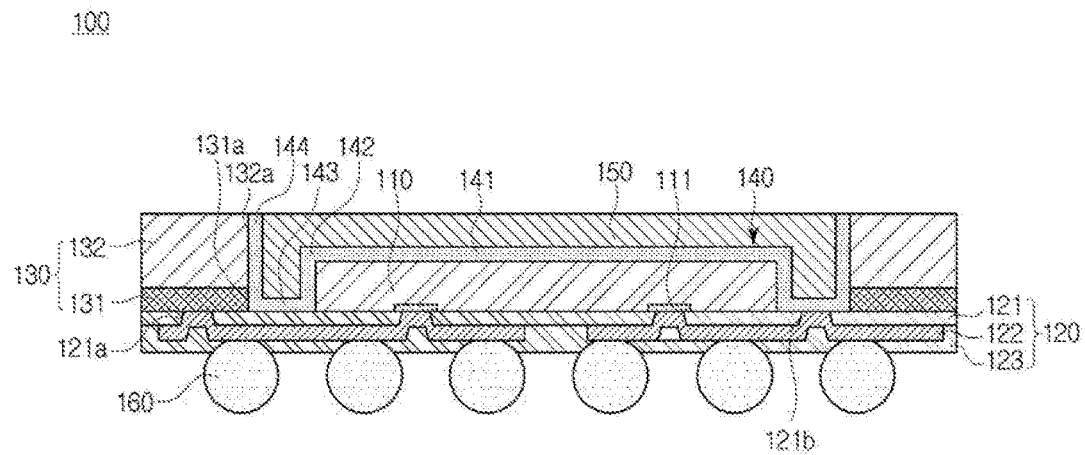

Referring to FIG. 15, after the external connection terminal 160 is formed, the process carrier substrate P may be removed, and at the same time, the adhesive layer A may be removed, so that the semiconductor package 100 is manufactured.

In addition, when the semiconductor package is manufactured at wafer level or at panel level so that a plurality of semiconductor packages are manufactured together, the plurality of semiconductor packages are cut and separated into individual semiconductor packages, thereby manufacturing the individual semiconductor packages as final products.

Hereinafter, a semiconductor package 200 according to another embodiment of the present disclosure will be described with reference to FIG. 16.

In the following description, parts identical to those of the semiconductor package 100 in the previous embodiment will be simplified or omitted.

Figure 16:
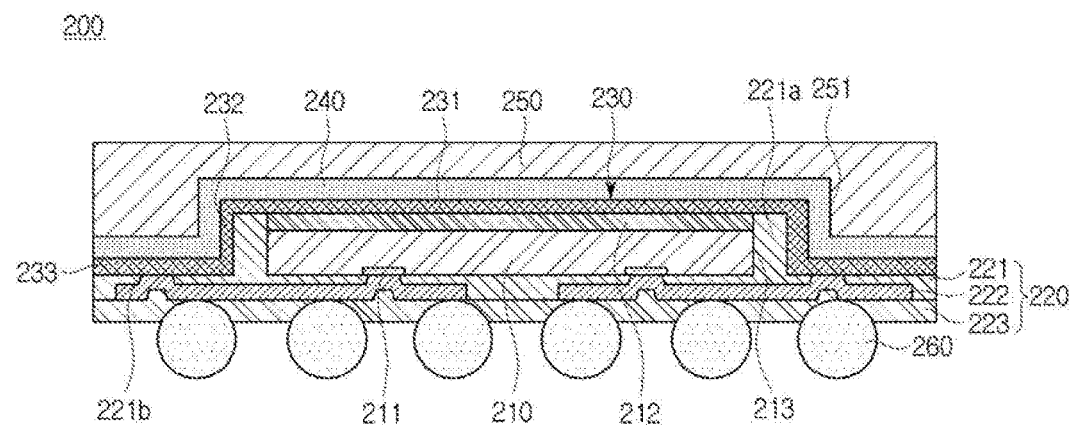
FIG. 16 is a cross-sectional view illustrating a semiconductor package according to another embodiment of the present disclosure.

FIG. 16 is a cross-sectional view illustrating the semiconductor package 200 according to the embodiment of the present disclosure.

Referring to FIG. 16, a semiconductor package 200 according to the embodiment of the present disclosure includes a semiconductor chip 210, an interconnection part 220, an EMI shielding part 230, a primer part 240, an insulating frame 250 and an external connection terminal 260.

The semiconductor chip 210 is disposed on the interconnection part 220 and is electrically or electronically connected to the interconnection part 220 through a bonding pad 211.

The semiconductor chip 210 may be an integrated circuit (Die or Integrated Circuit: IC). The semiconductor chip 210 may be a memory chip or a logic chip. The memory chip may include a DRAM, an SRAM, a flash, a PRAM, an ReRAM, an FeRAM, an MRAM, and the like. The logic chip may be a controller that controls memory chips.

The semiconductor chip 210 may have an active surface including an active area in which a circuit is formed and an inactive surface that is a surface opposite to the active surface.

The bonding pad 211 for exchanging signals with the outside may be formed on the active surface. In this case, the bonding pad 211 may be integrally formed with the semiconductor chip 210, and may be formed on the same plane as the active surface.

The semiconductor chip 210 may exchange signals with the outside through a bump attached to one surface of the semiconductor chip 210 rather than through the bonding pad 211. The bump attached to one surface of the semiconductor chip 210 may be a copper pillar bump or a solder bump.

An adhesive layer 212 may be provided on an inactive area in which the circuit of the semiconductor chip 210 is not formed, that is, the inactive surface opposite to the active surface. The adhesive layer 212 is configured to make the semiconductor chip 210 close contact with the EMI shielding part 230 and may also serve to prevent the semiconductor chip 210 from being separated.

The adhesive layer 212 may be provided using a double-sided adhesive film. One side of the adhesive layer 212 may be attached and fixed to the semiconductor chip 210, and the other side thereof may be attached and fixed to the EMI shielding part 230.

The semiconductor chip 210 may be disposed on the interconnection part 220 to be spaced apart from the EMI shielding part 230. The semiconductor chip 210 may be disposed on the interconnection part 220 to be spaced apart from the EMI shielding part 230 to form a space part 212 in which a first insulating layer 221 of the interconnection part 220, which will be described below, is inserted and firmly fixed.

The interconnection part 220 may be formed by performing a redistribution process on a metal interconnection. For example, a metal interconnection having a fine pattern may be formed on one surface of a semiconductor wafer on which the bonding pad 211 is formed, that is, an active surface, by using a photoresist process and a plating process.

The interconnection part 220 reroutes the semiconductor chip 210 to form a circuit. As the semiconductor chip 210 is rerouted by the interconnection part 220, the semiconductor package 200 may have a fan-out structure, and the input/output terminals of the semiconductor chip 210 may be miniaturized and may be increased in number.

The interconnection, part 220 may include a first insulating layer 221, a redistribution layer 222, and a second insulating layer 223. The first insulating layer 221, the redistribution layer 222, and the second insulating layer 223 may be sequentially stacked under the semiconductor chip 210.

The first insulating layer 221 may be disposed between the semiconductor chip 210 and the redistribution layer 222. The redistribution layer 222 may be disposed between the first insulating layer 221 and the second insulating layer 223. The second insulating layer 223 may be disposed under the redistribution layer 222.

The first insulating layer 221 is disposed under the semiconductor chip 210 and may be formed to surround a lower surface and a lateral surface of the semiconductor chip 210. The first insulating layer 221 may be disposed under the semiconductor chip 210 to be inserted into a space part 213 of the semiconductor chip 210.

The first insulating layer 221 may include a protrusion part 221a inserted into the space part 213 of the semiconductor chip 210. The protrusion part 221a may extend along a circumference of the lateral side of the semiconductor chip 210 and have a width adjusted to correspond to the width of the space part 213 provided between the semiconductor chip 210 and the EMI shielding part 230.

When the protrusion part 221a is inserted into the space part 213 of the semiconductor chip 210 to fix the semiconductor chip 20, the semiconductor chip 210 may be firmly supported from an external impact or the like, thus is prevented from being separated.

The first insulating layer 221 may be provided with an opening 221b for exposing the EMI shielding part 230.

The first insulating layer 221 may be formed of photosensitive Thick Polyimide (PI) or non-photosensitive Thick Polyimide (PI).

The first insulating layer 221 may include an organic or inorganic insulating material. The first insulating layer 221 may include an organic insulating material, such as an epoxy resin, and may include an inorganic insulating material, such as silicon oxide (SiOx), silicon nitride (SiNx), or the like.

The first insulating layer 221 may be formed by a dielectric coating.

The redistribution layer 222 may be connected to the bonding pad 211 of the semiconductor chip 210 and the external connection terminals. The redistribution layer 222 may be connected to the bonding pad 211 of the semiconductor chip 210 and the EMI shielding part 230.

The redistribution layer 222 may include a conductive material. The redistribution layer 222 may include a metal, and may include copper (Cu), aluminum (Al), or an alloy thereof.

The redistribution layer 222 may be formed on the first insulating layer 221 by a metal patterning technique.

The second insulating layer 223 is disposed under the redistribution layer 222 and is, provided with a hole formed to connect the redistribution layer 222 to the external connection terminal 260.

The second insulating layer 223 may include an organic or inorganic insulating material. The second insulating layer 223 may include an organic insulating material, such as an epoxy resin, and may include an inorganic insulating material, such as silicon oxide (SiOx), silicon nitride (SiNx), or the like.

The second insulating layer 223 may be formed of a dielectric coating.

The EMI shielding part 230 may cover the semiconductor chip 210 while covering the outer surface of the semiconductor chip 210 disposed on the interconnection part 220. The EMI shield 230 may be provided to cover an upper surface of the semiconductor chip 210 disposed on the interconnection part 220 and an upper surface and a lateral surface of the first insulating layer 221.

The EMI shielding part 230 includes a first surface 231 covering the upper surface of the semiconductor chip 210 and an upper surface of the protrusion part 221a, a second surface 232 covering a lateral surface of the protrusion part 221a, and a third surface 233 in contact with the interconnection part 220.

The first surface 231 may be provided to be stacked on the semiconductor chip 210 and the protrusion part 221a in combination with the adhesive layer 212, and the second surface 232 may be formed in a bent shape bent at an end portion of the first surface 231 and extending along the lateral surface of the protrusion part 221a, and the third surface 233 may be formed in a bent shape bent at an end portion of the second surface 232 and extending along the interconnection part 220.

The EMI shielding part 230 may be connected to the redistribution layer 222, and may be connected to the redistribution layer 222 through the opening 221b formed through the first insulating layer 221.

The EMI shielding part 230 may be electrically or electronically connected to the redistribution layer 222 with the third surface 233 in contact with the redistribution layer 222.

The EMI shielding part 230 may be formed of a film having a thickness thinner than that of the semiconductor chip 210 to achieve slimming of the semiconductor package 200.

The EMI shielding part 230 may be a shielding film that may shield EMI. The EMI shielding part 230 may include a conductive material including at least one selected from the group consisting of metals and ceramics. More specifically, the EMI shielding part 230 may include at least one selected front the group consisting of copper (Cu), gold (Au), silver (Ag), and titanium (Ti).

The primer part 240 is disposed on the EMI shielding part 230 to cover the entire surface of one side of the EMI shielding part 230 to facilitate the coupling of the EMI shielding part 230 and the insulating frame 250. The prime part 240 may be disposed on the EMI shielding part 230 to cover the first surface 231, the second surface 232, and the third surface 233 of the EMI shielding part 230.

The primer part 240 may have a thickness greater than that of the EMI shielding part 230 or may have the same thickness as that of the EMI shielding part 230.

The primer part 240 may be formed of a material that increases the interfacial adhesion between the EMI shielding part 230 and the insulating frame 250, and may be composed of a metal sputter layer.

The primer part 240 may include a conductive material. When the primer part 240 includes a conductive material, the thickness of the EMI shielding part 230 that shields the EMI may be reduced, and the weight, thickness, and volume of the semiconductor package 200 may be reduced.

The insulating frame 250 is formed on the primer part 240. The insulating frame 250 provides the overall frame of the semiconductor package 200 and serves as a frame on which the semiconductor chip 210, the interconnection part 220, the EMI shielding part 230, the primer part 240, and the external connection terminal 260 are disposed, while serving as a packing material for sealing the semiconductor chip 210.

The insulating frame 250 is formed earlier than the interconnection part 220 the EMI shielding part 230, the primer part 240, and the external connection terminal 260 to serve as a frame on which the interconnection part 220, the EMI shielding part 230, the primer part 240, and the external connection terminal 260 are be disposed, and as the primer part 240, the EMI shielding part 230, the semiconductor chip 210, the interconnection part 220, and the external connection terminal 260 are disposed on the insulating frame 250, the semiconductor package 200 is provided.

The insulating fret e 250 is formed with an accommodation part 251 to accommodate the semiconductor chip 210 the EMI shielding part 230 and the primer part 240 therein.

The insulating frame 250 may include an insulating material and may include an epoxy mold compound (EMC) or an encapsulant (packing material).

The insulating, frame 250 may be processed in the form of an epoxy mold (EMC) frame.

The external connection terminal 260 is disposed under the interconnection part 220 and is electrically or electronically connected to the interconnection part 220. The external connection terminal 260 may be electrically or electronically connected to the redistribution layer 222 to thereby be connected to the semiconductor chip 210. The external connection terminal 260 may be electrically or electronically connected to the redistribution layer 222 through a separate metal layer, such as a bump.

The external connection terminal 260 may be electrically or electronically connected to the semiconductor chip 210 to allow input and output of electrical or electronic signals with the semiconductor chip 210.

The external connection terminal 260 is electrically or electronically connected to the interconnection part 220 and may be used as a medium for connecting the semiconductor package 200 to an external circuit or another semiconductor package. For example, the external connection terminal 260 may be connected to the redistribution layer 222 or the bump metal layer at one side thereof and may be exposed to the outside at the other side thereof.

Although a solder ball is illustrated as an example of the external connection terminal 260, the external connection terminal 260 may be formed of other materials than a solder bump or solder.

The surface of the external connection terminal 260 may be subjected to a surface treatment, such as organic coating or metal plating, and thus is prevented from being oxidized. The organic coating may be achieved by an Organic Solder Preservation (OSP) coating, and the metal plating gold (Au) nickel (Ni) lead (Pb), or silver (Ag) plating.

Hereinafter, a method of manufacturing the semiconductor package according to the embodiment of the present disclosure will be described.

In the following description, parts identical to those of the semiconductor package 200 described with reference to FIG. 16 will be simplified or omitted.

FIGS. 17 to 27 are sectional views for describing method of manufacturing the semiconductor package 200 shown in FIG. 16.

Referring to FIGS. 17 to 27, the method of manufacturing the semiconductor package 200 according to the embodiment of the present disclosure includes sequentially stacking the primer part 240, the EMI shielding part 230, the semiconductor chip 210, the interconnection part 220, and the external connection terminal 260 on the insulating frame 250.

In the case of the semiconductor package 200 being manufactured by sequentially stacking the primer part 240, the EMI shielding part 230, the semiconductor chip 210, the interconnection part 220, and the external connection terminal 260 on the insulating frame 250, a process of replacing the carrier C or a process of separating the semiconductor package being manufactured from the carrier C and reversing the semiconductor package to form the insulating frame 250 or the interconnection part 220 is omitted, so that the manufacturing cost is reduced and the production efficiency may be improved.

Figure 17:
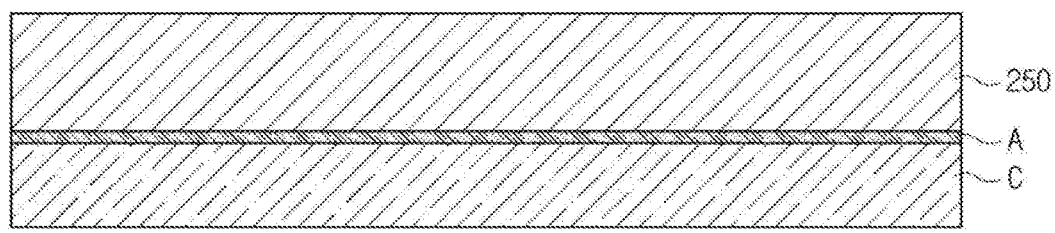
FIGS. 17 to 27 are sectional views showing a method of manufacturing the semiconductor package shown in FIG. 6.
Figure 18:
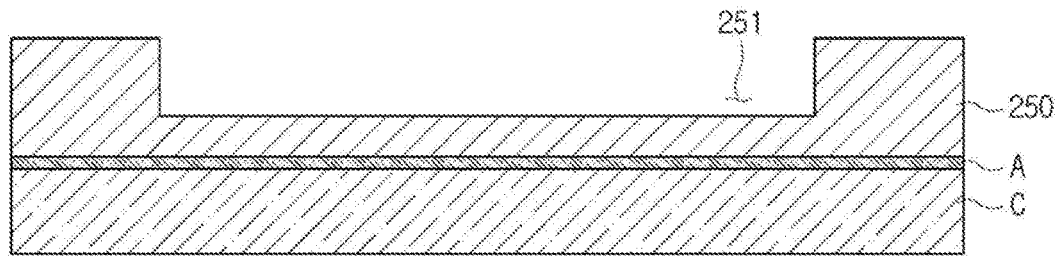

FIGS. 17 and 18 show steps for forming a frame using the insulating frame 250. The insulating frame 250 is disposed on the carrier substrate C on which the adhesive layer A is formed, the insulating frame 250 is processed to form the accommodation part 251 so that the insulating frame 250 takes a form of a frame.

The insulative frame 250 may include an insulating material, such as an epoxy mold compound (EMC) or an encapsulant (packing material), and the epoxy molding compound may be molded end then processed to take a form of a frame.

The carrier substrate C may be implemented as a ceramic substrate, a silicon or silicon oxide substrate, a glass substrate, or the like. The carrier substrate C may be provided at wafer level.

Figure 19:
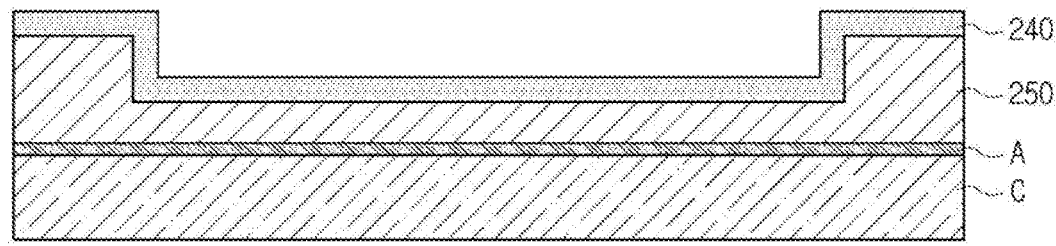

Referring to FIG. 19, the primer part 240 is formed on one side of the insulating frame 250 in the form of a frame. The primer part 240 may be formed to cover the entire area of the one side of the insulating frame 250.

Figure 20:
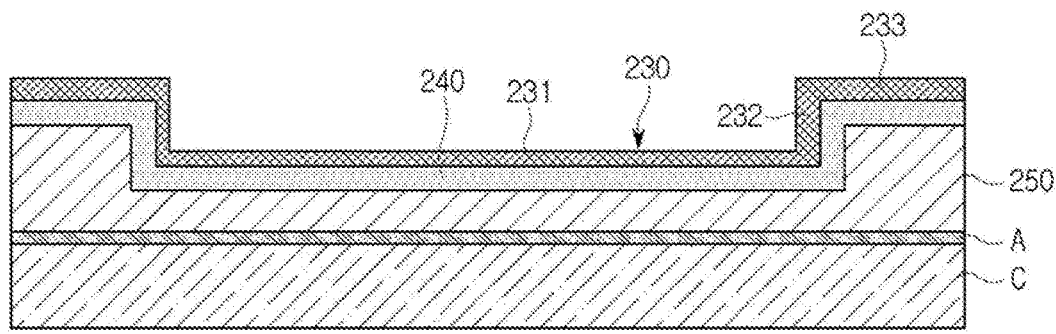

Referring to FIG. 20, the EMI shielding part 230 connected to the redistribution layer 222 while covering the semiconductor chip 210 is formed on the primer part 240.

The EMI shielding part 230 may be a shielding film capable of shielding EMI, and may include, a conductive material including at least one selected from the group consisting of metals and ceramics. The EMI shielding part 140 may include at least one selected from the group consisting of copper (Cu) gold (Au), silver (Ag), and titanium (Ti).

Figure 21:
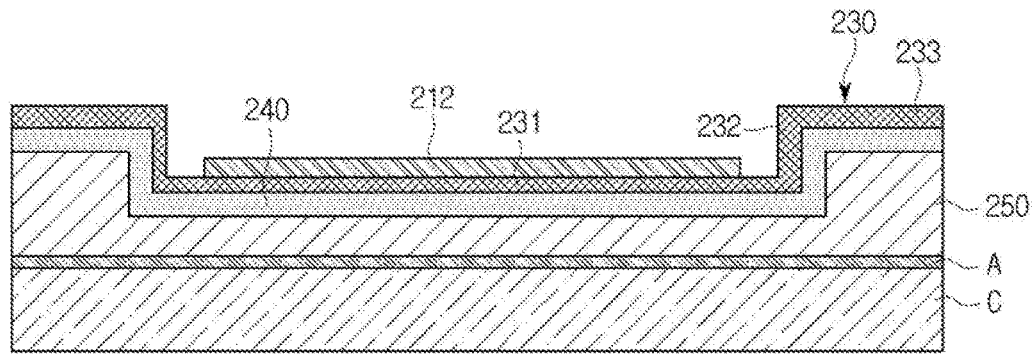
Figure 22:
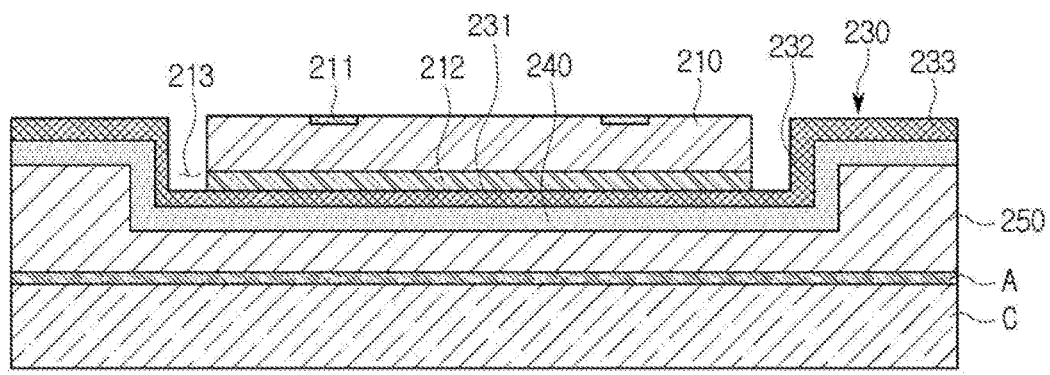

Referring to FIGS. 21 and 22, the adhesive layer 212 is applied to the first surface 231 of the EMI shielding part 230, and the semiconductor chip 210 is disposed to be spaced apart from the EMI shielding part 230 such that the space part 213 is formed.

The semiconductor chip 210 is disposed in the EMI shielding part 230 such that the active surface of the semiconductor chip 210, that is, one side of the semiconductor chip 210 on which the bonding pad 211 is formed, is disposed opposite to the adhesive layer 212.

Figure 23:
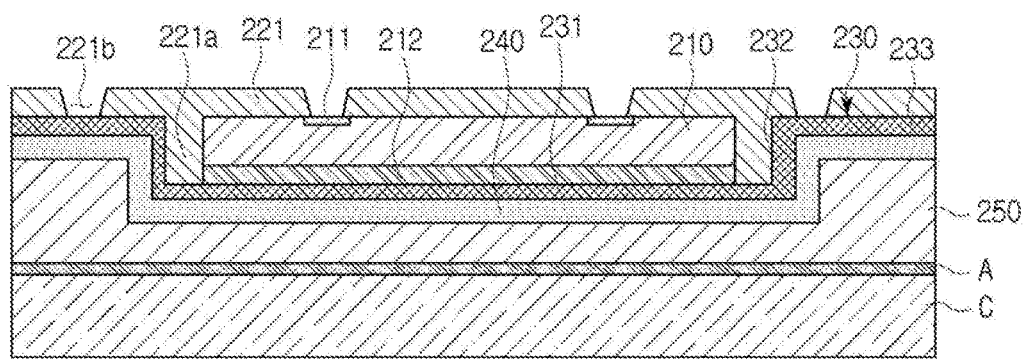

Referring to FIG. 23, the first insulating layer 221 is formed on the active surface of the semiconductor chip 210, that is, one surface of the semiconductor chip 210 on which the bonding pad 211 is formed. The protrusion part 221a inserted into the space part 213 of the semiconductor chip 210 may be formed together with the first insulating layer 221, and the protrusion part 221a formed together with the first insulating layer 221 may be fixedly inserted into the space part 213 to fill the space between the semiconductor chip 210 and the EMI shielding part 230.

The first insulating layer 221 may be formed by coating an insulating material on one surface of the semiconductor chip 110 and performing a patterning process on the coated insulting material to form a hole for exposing the bonding pad 211. The insulating material may be provided using photosensitive Thick polyimide (PI, Polyimide) or non-photosensitive Thick PI (Polyimide).

The opening 221b for exposing the EMI shielding part 230 is formed through the patterning process of the first insulating layer 221.

Figure 24:
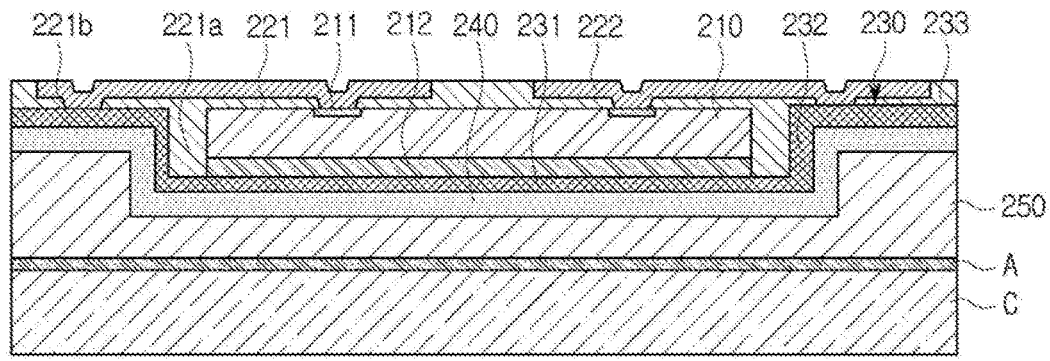

Referring to FIG. 24, the redistribution layer 222 is formed on the patterned first insulating layer 221. The redistribution layer 222 is connected to the bonding pad 211. The redistribution layer 222 is connected to the EMI shielding part 230 through the opening 221b. The redistribution layer 122 may be formed as a metal pattern by coating a metal material on the first insulating layer 121 and then performing a photoresist process or the like on the coated metal. The redistribution layer 122 may be coated through a general plating process.

As the semiconductor chip 210 is redistributed by the redistribution layer 222, the semiconductor package 200 is provided in a fan-out structure.

Figure 25:
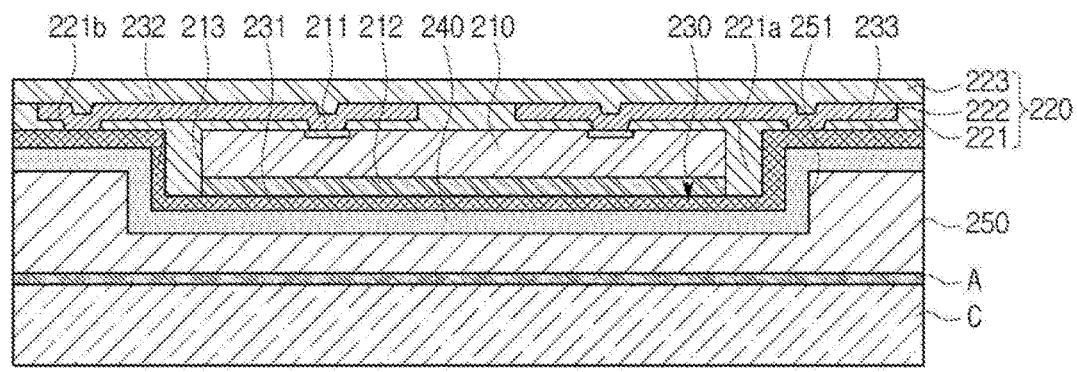

Referring to FIG. 25, the second insulating layer 223 is formed on the redistribution layer 222. The second insulating layer 223 may be formed by coating an insulating material on the redistribution layer 222 and performing a patterning process on the coated insulating material to form a hole for exposing a part of the redistribution layer 222. The insulating material may be formed of photosensitive PI (Polyimide) or Thick PI (Polyimide). The insulating material may be formed of photosensitive Thick PI (Polyimide) or non-photosensitive Thick PI (Polyimide).

Figure 26:
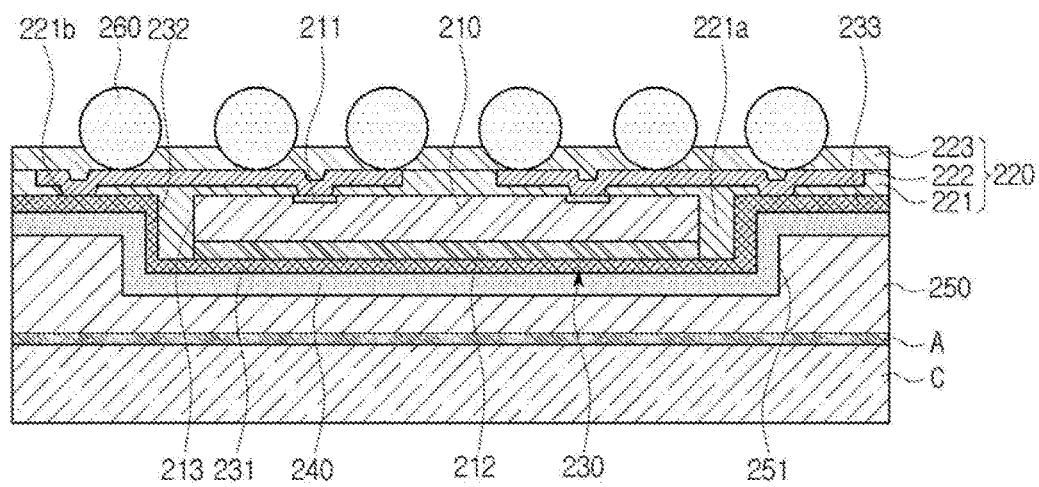

Referring to FIG. 26, the external connection terminal 260 is formed on the interconnection part 220 connected to the semiconductor chip 210.

The external connection terminal 260 may be connected to the redistribution layer 222 through the hole formed in the second insulating layer 223, and alternatively, may be connected to the redistribution layer 222 through a separate bump metal layer. In the case of the bump metal layer, through which the external connection terminal 260 is connected to the redistribution layer 222, the bump metal layer is formed by coating a metal material on the second insulating layer 223 and then performing a photoresist process on the coated metal material, to form a metal pattern.

The external connection terminal 260 is electrically or electronically connected to the interconnection part 220, and may be used as a medium for connecting the semiconductor package 200 to an external circuit or another semiconductor package. For example, the external connection terminal 260 may be connected to the redistribution layer 222 at one side thereof and may be exposed to the outside at the other side thereof.

Figure 27:
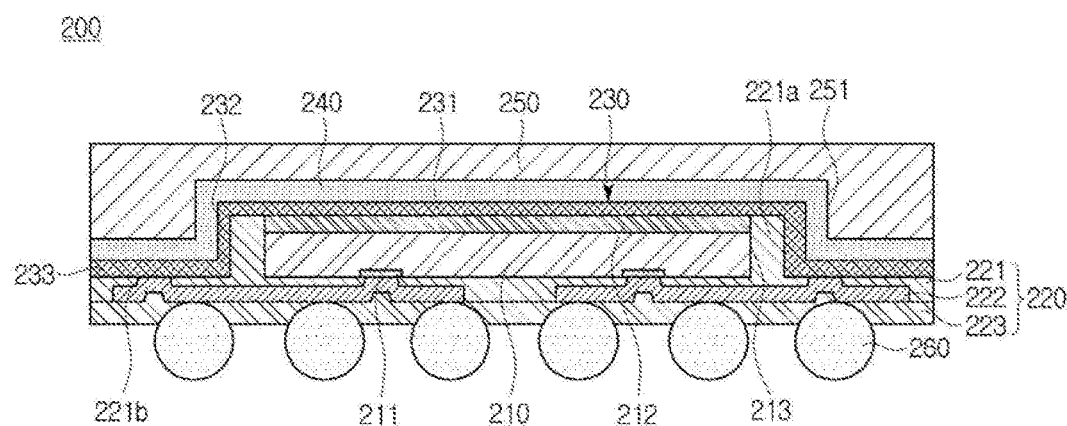

Referring to FIG. 27, after the external connection terminal 260 is formed, the carrier substrate C may be removed, and at the same time, the adhesive layer A is removed, so that the semiconductor package 200 is manufactured.

In addition when the semiconductor package is manufactured at wafer level or panel level so that a plurality of semiconductor packages are manufactured together, the plurality of semiconductor packages are cut and separated into individual semiconductor packages to thereby manufacturing the individual semiconductor packages as final products.

As is apparent from the above, the semiconductor package according to the embodiment of the present disclosure can prevent EMI shielding performance from being lowered due to peel-off or damage of an EMI shielding part for shielding EMI by disposing the EMI shielding part inside the semiconductor package.

The semiconductor package according to the embodiment can reduce the volume of the semiconductor package while preventing a semiconductor chip from being damaged by disposing the semiconductor chip at an inside of a frame including a first frame and a second frame.

What is claimed is:
1. A semiconductor package comprising:
an interconnection part including an insulating layer and an interconnection layer;
a semiconductor chip provided on the interconnection part and electrically connected to the interconnection layer through a bonding pad;
a frame provided on the interconnection part and provided with an accommodation part in which the semiconductor chip is disposed; and
an electromagnetic interference (EMI) shielding part configured to cover lateral surfaces of the semiconductor chip and the accommodation part and provided with an exposing part exposed to an outside;
a first frame provided on the interconnection part, provided with a first accommodation part in which the semiconductor chip is disposed, and formed of a metal frame; and
a second frame provided on the first frame while covering the first frame, provided with a second accommodation part in which the semiconductor chip is disposed, and formed of an insulating frame.

2. The semiconductor package of claim 1, wherein the interconnection part includes:
a redistribution layer connected to the bonding pad of the semiconductor chip;
a first insulating layer disposed between the semiconductor chip and the redistribution layer; and
a second insulating layer disposed at a lower side of the redistribution layer,
wherein the first frame is connected to the redistribution layer through a first opening formed through the first insulating layer.

3. The semiconductor package of claim 2, wherein the EMI shielding part is connected to the redistribution layer through a second opening formed through the first insulating layer.

4. The semiconductor package of claim 3, further comprising a packing material formed on the EMI shielding part to seal the semiconductor chip.

5. The semiconductor package of claim 4, further comprising an external connection terminal electrically connected to the redistribution layer.

6. A semiconductor package comprising:
an interconnection part including an insulating layer and an interconnection layer;
a semiconductor chip provided on the interconnection part and electrically connected to the interconnection layer through a bonding pad;
a frame provided on the interconnection part and provided with an accommodation part in which the semiconductor chip is disposed;
an electromagnetic interference (EMI) shielding part configured to cover lateral surfaces of the semiconductor chip and the accommodation part and provided with an exposing part exposed to an outside;
a space part formed by the lateral surface of the semiconductor chip and the EMI shielding part disposed to be spaced apart from each other; and
an insulating frame provided with an accommodation part in which the semiconductor chip, the EMI shielding part, and the space part are disposed.

7. The semiconductor package of claim 6, wherein the interconnection part includes:
a redistribution layer connected to the bonding pad of the semiconductor chip;
a first insulating layer disposed between the semiconductor chip and the redistribution layer, and provided with a protrusion extending along a circumference of the lateral surface of the semiconductor chip and inserted into the space part; and a second insulating layer disposed at a lower side of the redistribution layer.

8. The semiconductor package of claim 7, wherein the EMI shielding part is connected to the redistribution layer through an opening formed through the first insulating layer.

9. The semiconductor package of claim 8, further comprising an adhesive layer provided between the semiconductor chip and the EMI shielding part.

10. The semiconductor package of claim 9, further comprising a primer part provided between the EMI shielding part and the insulating frame.

11. The semiconductor package of claim 10, further comprising an external connection terminal electrically connected to the redistribution layer.

\* \* \* \* \*